(12) United States Patent
Kim et al.

(10) Patent No.: US 7,631,795 B2
(45) Date of Patent: Dec. 15, 2009

(54) SYSTEM AND METHOD FOR AUTOMATED WIRE BONDING

(75) Inventors: Byung-Soo Kim, Cheonan-si (KR);
Suk-Chun Jung, Cheonan-si (KR);
Kook-Jin Oh, Cheonan-si (KR);
Young-Han Kwon, Cheonan-si (KR);
Tae-Hyuk Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 696 days.

(21) Appl. No.: 10/981,637

(22) Filed: Nov. 5, 2004

(65) Prior Publication Data
US 2005/0173491 A1   Aug. 11, 2005

(30) Foreign Application Priority Data
Feb. 9, 2004   (KR) ................ 10-2004-0008352

(51) Int. Cl.
*B23K 37/00* (2006.01)
(52) U.S. Cl. .............. 228/4.5; 228/8; 228/103; 228/104; 228/180.5; 716/11
(58) Field of Classification Search ........... 228/4.5, 228/18.5, 102, 103, 104; 219/56, 56.1, 56.21, 219/56.22; 716/11; 257/784
See application file for complete search history.

(56) References Cited
U.S. PATENT DOCUMENTS

| | | | |
|---|---|---|---|
| 5,498,767 A * | 3/1996 | Huddleston et al. | 716/12 |
| 5,816,477 A * | 10/1998 | Shimizu | 228/102 |
| 6,080,651 A * | 6/2000 | Takahashi et al. | 438/617 |
| 6,330,485 B1 * | 12/2001 | Hsu et al. | 700/90 |
| 6,572,001 B2 * | 6/2003 | Wong et al. | 228/4.5 |
| 6,851,100 B1 * | 2/2005 | You et al. | 716/11 |
| 7,085,699 B2 * | 8/2006 | Variyam | 703/13 |

FOREIGN PATENT DOCUMENTS

| | | |
|---|---|---|
| JP | 05-315389 | 11/1993 |
| JP | 06-132347 | 5/1994 |
| KR | 2001-0081595 | 8/2001 |
| KR | 2003-0005037 | 1/2003 |
| KR | 2003-0073363 | 9/2003 |

* cited by examiner

*Primary Examiner*—Jessica L. Ward
*Assistant Examiner*—Michael Aboagye
(74) *Attorney, Agent, or Firm*—Harness, Dickey & Pierce, P.L.C.

(57) ABSTRACT

A bonder viewer system may provide an automated procedure for determining a wire bonding sequence based on information provided by a drawing management system. The bonder viewer system may include a bonding sequence decision unit receiving pad and lead coordinate data corresponding to an IC chip, and determining a bonding sequence for bonding wires of the IC chip. The bonder viewer system may further include a turning point check unit and a bonding simulation unit which may provide modifications to the bonding sequence information, which may be based on whether a capillary of a wire bonder is in contact with a pre-bonded wire of the IC chip. The bonder viewer system may also include a standard file generator for generating data based on the bonding sequence information and a translator for preparing the data in a format suitable for a wire bonder.

20 Claims, 12 Drawing Sheets

$(0 < \theta < \pi)$ $(0 < \theta < \pi)$ $(-\pi < \theta < \pi)$ $(-\pi < \theta < 0)$

SYSTEM AND METHOD FOR AUTOMATED WIRE BONDING

CROSS REFERENCE TO RELATED APPLICATIONS

This U.S. non-provisional application claims priority under 35 U.S.C. § 119 from Korean Patent Application No. 2004-8352, which was filed in the Korean Intellectual Property Office on Feb. 9, 2004, the contents of which are incorporated by reference herein in its entirety.

BACKGROUND OF THE INVENTION

1. Field of the Invention

The present invention relates generally to semiconductor packaging technology and automated wire bonding.

2. Description of the Related Art

In a semiconductor packaging process, wire-bonding techniques may be used to form electrical interconnections between an integrated circuit (IC) chip and a next-level substrate, for example a lead frame. As IC chips have become more integrated, smaller, and/or faster, the bond pads, provided on the IC chip, have tended to increase in number while tending to become smaller, for example in area and/or pitch. As a result, the number of bonding wires may also increase which may cause the pitch to decrease, thus making the wire bonding process more complicated.

In advanced type packages, for example, multi-pin packages, chip-stack packages, or multi-bonded packages, the wire bonding process may require that a large quantity of information be put into a wire bonder. In the past, an engineer may have been responsible for entering information manually into a wire bonder, thus an appreciable amount of time may have been required for configuring a wire bonding process.

A conventional approach for managing an automated wire bonding process may include an integrated management system. The integrated management system may automatically execute a procedure for reviewing and editing an assembly reference, and a bonding specification used for manufacturing IC chip packages. The integrated management system may also include a drawing management system (DMS) for creating an assembly reference, and a bonding specification drawing system which may create a bonding specification, based on the assembly reference.

SUMMARY OF THE INVENTION

Exemplary embodiments of the present invention may provide a bonder viewer system configured to automatically determine a wire bonding sequence, where information may be based on and/or provided by a drawing management system (DMS) of the automated wire bonding system.

An exemplary embodiment of the present invention may provide a bonder viewer system including a bonding sequence decision unit for receiving information regarding an IC chip and/or a substrate, deciding a bonding sequence for bonding wires, and creating bonding sequence information. The bonder viewer system may further include a turning point check unit for checking whether a capillary is in contact with a pre-bonded wire when following the bonding sequence information, and deciding whether to change the bonding sequence based on a pre-bonded wire, and create a first modified bonding sequence. In addition, the bonder viewer system may include a bonding simulation unit that performs a bonding simulation based on the first modified bonding sequence information, and creates a second modified bonding sequence based on the simulation.

Exemplary embodiments of the present invention may further include a standard file generator for generating a standard file based on the second modified bonding sequence information, and a translator for translating the standard file into a machine language file suitable for a wire bonder. At least one wire bonder may perform wire bonding based on the machine language file of the translation unit. A drawing management system may also be included for generating at least two types of wire bonding information, and/or providing that information to the bonding sequence decision unit.

Another exemplary embodiment of the present invention may include a reference point creation unit for establishing at least one bonding start point, and/or choosing a bonding direction. The reference point creation unit may provide an imaginary wire creation unit, which may create imaginary wires by connecting at least one pad to at least one corresponding lead, a wire angle check unit for measuring at least one angle of a corresponding imaginary wire created and/or a bonding direction, a wire angle range check unit for determining a range of imaginary wire angles for at least one group of imaginary wires created, a wire group classification unit, which may classify the at least one imaginary wire group created into at least one of two different types of groups, a multi-lead bonding check unit for determining whether multi-lead bonding exists in the at least one group of imaginary wires, and/or a secondary bonding sequence decision unit for determining a bonding sequence for the imaginary wires.

Another exemplary embodiment of the present invention may include a real pad pitch calculation unit, which may include at least one minimum pad pitch calculation unit for calculating at least one minimum pad pitch. The real pad pitch calculation unit may further include at least one pad pitch comparison unit for comparing the real pad pitch with the at least one minimum pad pitch, and if the real pad pitch is greater than the at least one minimum pad pitch, then a turning operation may not be applied to a wire bonder, and if the real pad pitch is smaller than the first minimum pad pitch, then the at least one pad pitch comparison unit may determine not to perform wire bonding.

Exemplary embodiments of the present invention may include a second minimum pad pitch calculation unit for calculating a second minimum pad pitch, and a second pad pitch comparison unit comparing the real pad pitch with the second minimum pad pitch, and if the real pad pitch is greater than the second minimum pad pitch, the turning point may not be applied to the wire bonder, and if the real pad pitch is smaller than the second minimum pad pitch, then a turning point may be applied to the wire bonder.

Exemplary embodiments of the present invention may include a third minimum pad pitch calculation unit calculating a third minimum pad pitch, and a third pad pitch comparison unit comparing the real pad pitch with the third minimum pad pitch, and if the real pad pitch is greater than the third minimum pad pitch, the turning point may not be applied to the wire bonder, and if the real pad pitch is smaller than the third minimum pad pitch, then a wire angle of a real wire may be compared to a wire angle of a wire corresponding to the third minimum pad pitch and if the wire angle of the real wire is greater than the wire angle corresponding to the third minimum pad pitch then the turning point may not be applied to the wire bonder, and if the wire angle of the real wire is smaller, then the turning point may be applied to the wire bonder.

Exemplary embodiments of the present invention may include, a fourth minimum pad pitch calculation unit for calculating a fourth minimum pad pitch, a fourth pad pitch comparison unit for comparing the real pad pitch with the fourth minimum pad pitch, and if the real pad pitch is greater than the fourth minimum pad pitch, the turning point may not be applied to the wire bonder, and if the real pad pitch is smaller than the fourth minimum pad pitch, then the turning point may be applied to the wire bonder.

Another exemplary embodiment of the present invention may provide a method including, calculating a real pad pitch and at least one minimum pad pitch and comparing the real pad pitch with the at least one minimum pad pitch, and if the real pad pitch is greater than the at least one minimum pad pitch, then no turning operation may be applied to a wire bonder, and if the real pad pitch is smaller than the first minimum pad pitch, then wire bonding may not be performed.

Another exemplary embodiment of the present invention may include a method including, supplying at least one type of chip data, deciding a sequence for a bonding operation based on the at least one type of chip data, creating bonding sequence information, determining whether to apply a turning point based on the bonding sequence information, creating a first modified bonding sequence information based on the determining operation, performing a bonding simulation based on the first modified bonding sequence information, creating a second modified bonding sequence information based on the bonding simulation, and preparing the second modified bonding sequence information for use by a wire bonder.

Another exemplary embodiment of the present invention may include a method including, supplying at least one type of chip data, creating at least two imaginary wires, determining angles of the at least two imaginary wire, classifying the at least two imaginary wires individually into a either a first type of group of either all positive or all negative imaginary wire angles but not both, or a second type of group having both positive and negative imaginary wire angles, determining if the type of bonding of the at least two imaginary wires is multi-lead bonding, determining a bonding sequence of each of the at least two imaginary wires, and creating a second modified bonding sequence information based on the simulation.

Another exemplary embodiment of the present invention may provide a method including, calculating a minimum pad pitch and a lead pad pitch, and comparing the minimum pad pitch and the lead pad pitch, and if the lead pad pitch is smaller than the minimum pad pitch, then the type of bonding used may be determined as multi-lead type bonding, and if the lead pad pitch is not less than the minimum pad pitch, then a determination may be made that the type of bonding is not multi-lead type bonding.

BRIEF DESCRIPTION OF THE DRAWINGS

The present invention will become more apparent to those of ordinary skill in the art by describing, in detail, exemplary embodiments thereof with reference to the attached drawings, in which.

DETAILED DESCRIPTION OF THE EXEMPLARY EMBODIMENTS OF THE PRESENT INVENTION

Figure 1:
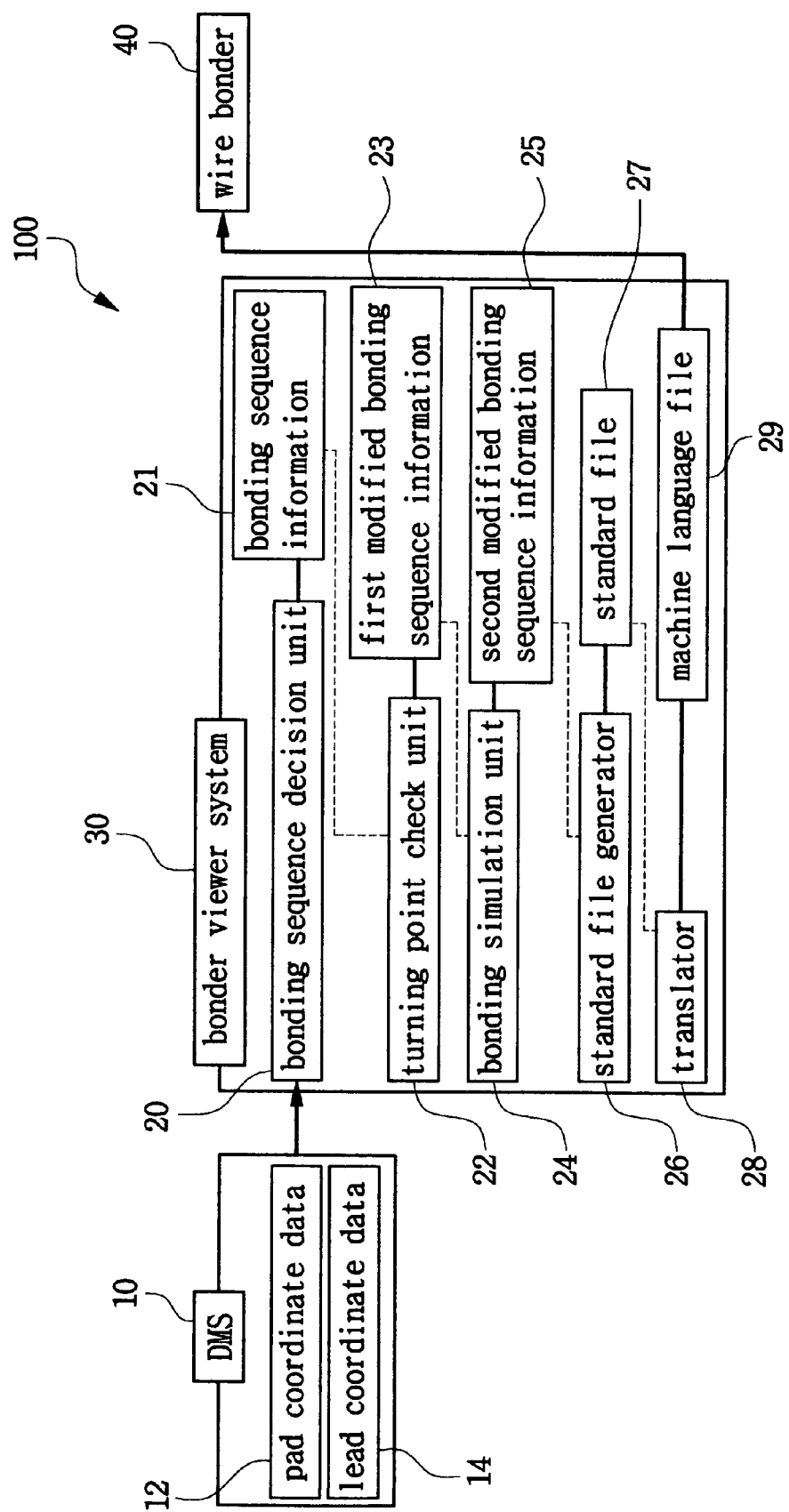
FIG. 1 illustrates a block diagram of a bonder viewer system in accordance with an exemplary embodiment of the present invention.

Exemplary embodiments of the present invention will now be described in detail with reference to the accompanying drawings. In the following drawings, like reference numerals identify similar or identical elements.

FIG. 1 illustrates a block diagram of a bonder viewer system 30 of an automated wire bonding system 100 according to an exemplary embodiment of the present invention.

Referring to FIG. 1, bonder viewer system 30 may receive information from a drawing management system (DMS) 10 and create information used for wire bonding. Bonder viewer system 30 may provide translation for the information created, by translating the information into a format suitable for a wire bonder 40, which may represent one or a plurality of wire bonders. The bonder viewer system 30 may also provide the translated files to the wire bonder 40. The bonder viewer system 30 may produce a bonding sequence and/or perform a bonding simulation prior to an actual bonding procedure performed by the wire bonder 40. Bonder viewer 30 may also produce an automated turning point to reduce potential sagging failures which may occur between bonding wires for example, by contact between a capillary and a bonding wire.

The bonder viewer system 30, according to an exemplary embodiment of the present invention, may include a bonding sequence decision unit 20, a turning point check unit 22, a bonding simulation unit 24, a standard file generator 26, and/or a translator 28.

Bonding sequence decision unit 20, according to an exemplary embodiment of the present invention may receive data from DMS 10 for example, and may include pad coordinate data 12 of an IC chip and/or lead coordinate data 14 of a next-level substrate such as a lead frame type of chip package. Depending on the types of data provided by the DMS 10 to the bonding sequence decision unit 20, for example 12 and 14, the bonding sequence decision unit 20 may determine a bonding sequence and/or create bonding sequence information 21.

The turning point check unit 22, according to an exemplary embodiment of the present invention may check whether a capillary is in contact with a pre-bonded wire by following the bonding sequence information 21. The turning point check unit 22 may determine whether to change the bonding sequence information based on the position of the pre-bonded wire, and create a first modified bonding sequence information 23.

The bonding simulation unit 24, according to an exemplary embodiment of the present invention, may perform a bonding simulation based on the first modified bonding sequence information 23 to verify the accuracy of the first modified bonding sequence information 23. After the bonding simulation, the bonding simulation unit 24 may create a second modified bonding sequence information 25 based on the bonding simulation.

Standard file generator 26, according to an exemplary embodiment of the present invention, may generate a standard file 27 based on the second modified bonding sequence information 25. The translator 28 may translate the standard file 27 into a machine language file 29, which may be used by the wire bonder 40 to perform a wire bonding process.

Figure 2:
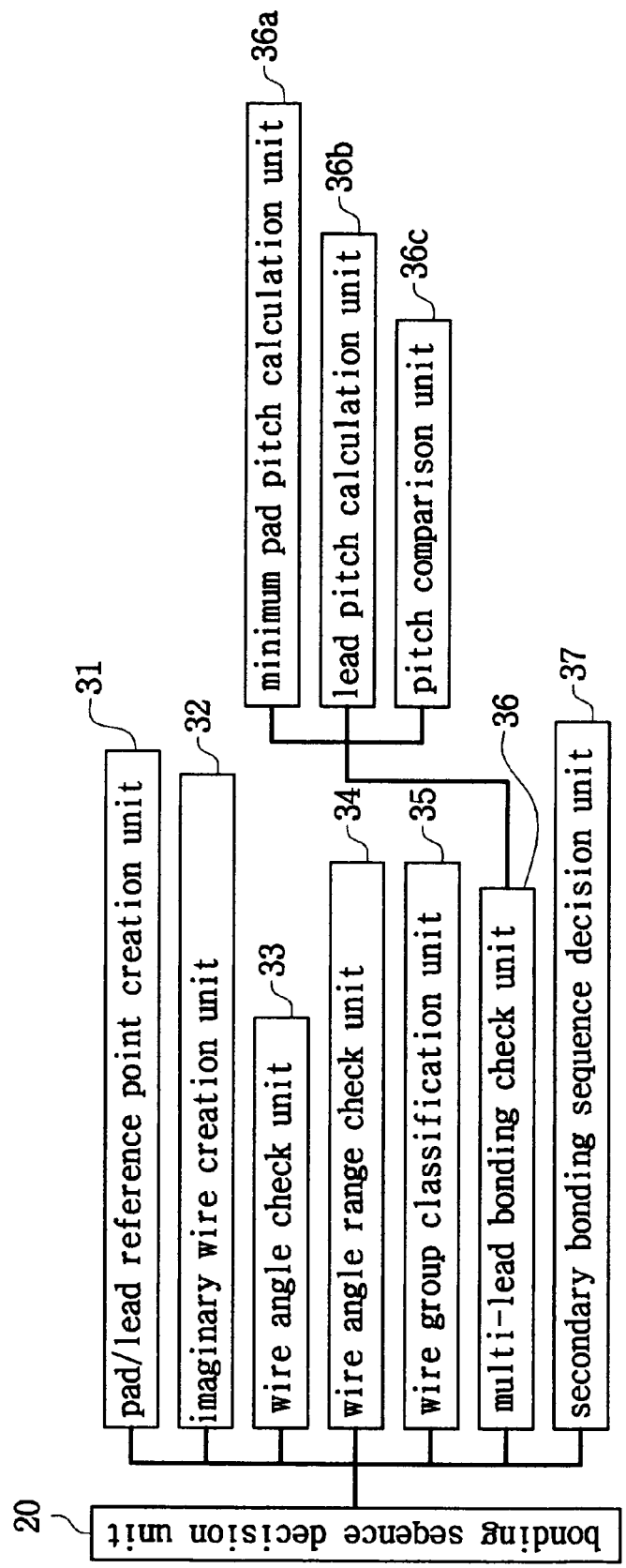
FIG. 2 illustrates a detailed block diagram of a bonding sequence decision unit as illustrated in FIG. 1.

FIG. 2 is a detailed block diagram of the bonding sequence decision unit 20 illustrated in FIG. 1. Referring to FIG. 2, and according to an exemplary embodiment of the present invention, the bonding sequence decision unit 20 may include a pad/lead reference point creation unit 31, an imaginary wire creation unit 32, a wire angle check unit 33, a wire angle range check unit 34, a wire group classification unit 35, a multi-lead bonding check unit 36, and/or a secondary bonding sequence decision unit 37.

The pad/lead reference point creation unit 31 of FIG. 2, according to an exemplary embodiment of the present invention, may establish a pair of bonding start points for choosing a bonding direction. One of the bonding start points may be a reference point for the pads of an IC chip, and the other may be a reference point for the leads of the substrate. The reference point location may depend on the configuration of the pads. Based on conventional configurations an IC chip may include an edge pad and/or a center pad type of pad configuration. An edge pad type chip for example, may include reference points set at a left uppermost pad area, and may include an attached wire-bonded lead. A center pad type chip having a single pad line for example, may include reference points set at a leftmost pad and may include a corresponding lead. A center pad type chip having double pad lines may include reference points set at a leftmost pad in a upper line, and may also include a corresponding lead. It will be appreciated, however, that the location of reference points may be located in other areas of a IC chip, and based on the type of chip pad configuration.

The imaginary wire creation unit 32 of FIG. 2, according to an exemplary embodiment of the present invention, may create imaginary wires by connecting a pad and a lead together one by one based on the corresponding reference point information. The wire angle check unit 33 may measure an angle of each imaginary wire and/or a corresponding bonding direction. For an edge pad type configuration the bonding direction may be for example, counterclockwise from the reference point. For a center pad type of chip configuration having a single pad line, the bonding direction may be for example, to the right of the reference point. A center pad type chip having double pad lines may have a bonding direction for example, to the right in the upper line and to the right in the lower line. Further, when an IC chip has both edge pads and center pads, the bonding of the edge pads may precede the bonding of the center pads. The bonding direction information may be included in by the bonding sequence information 21, as illustrated in FIG. 1.

The wire angle range check unit 34 of FIG. 2, according to an exemplary embodiment of the present invention, may examine a range of wire angles for a group of wires. Pads arranged in a straight line may be for example, defined as one group, and the angles of the corresponding wires bonded to the pads may be examined. Based on the range of the wire angles ($\theta$) examined, each group of wires may be for example, assigned to one of three categories, i.e., category A having a range of $-\pi<\theta<\pi$, category B having a range of $-\pi<\theta<0$, and category C having a range of $0<\theta<\pi$.

The wire group classification unit 35 of FIG. 2, according to an exemplary embodiment of the present invention, may classify the wire groups into an edge pad group and a center pad group to decide the bonding sequence of the wire groups. The edge pad group may be defined as a wire group having wire angles which may be either positive or negative, but not both. The center pad group may be defined as a wire group having wire angles which may vary between positive and negative. The wire group in category A may be for example, assigned to the center pad group, and the wire group in categories B and C may be assigned to the edge pad group. The center pads arranged in double lines may belong to the edge pad group, for example, if the wire angles of the upper line are positive and the wire angles of the lower lines are negative.

The multi-lead bonding check unit 36 of FIG. 2, according to an exemplary embodiment of the present invention, may determine whether a multi-lead bonding exists in a wire group. A conventional wire bonding process may connect a single pad to a single lead, where a multi-lead bonding may connect several pads to a single lead. Multi-lead bonding for example, double bonding and triple bonding, may require additional procedures when determining a bonding sequence. Therefore, the bonding sequence of a multi-lead bonding may be different from a single-lead bonding sequence.

The multi-lead bonding check unit 36 of FIG. 2, according to an exemplary embodiment of the present invention, may include a minimum pad pitch calculation unit 36a, a lead pitch calculation unit 36b, and a pitch comparison unit 36c. The minimum pad pitch calculation unit 36a may calculate a minimum pad pitch based on the pad pitches in a specified wire group. The lead pitch calculation unit 36b may calculate a lead pitch value. The pitch comparison unit 36c may provide a comparison between the lead pitch value and the minimum pad pitch, and if the lead pitch is smaller than the minimum pad pitch then the corresponding type of wire bonding may be regarded as multi-lead type bonding.

The secondary bonding sequence decision unit 37 of FIG. 2, according to an exemplary embodiment of the present invention, may determine a bonding sequence for the wires of a specified wire group. For example, a bonding sequence for a group of wires may be determined from left to the right, and where the wire angle is $0<|\theta|<\pi/2$, and from the right to the left where the wire angle is $\pi/2<|\theta|<\pi$.

Figure 3:
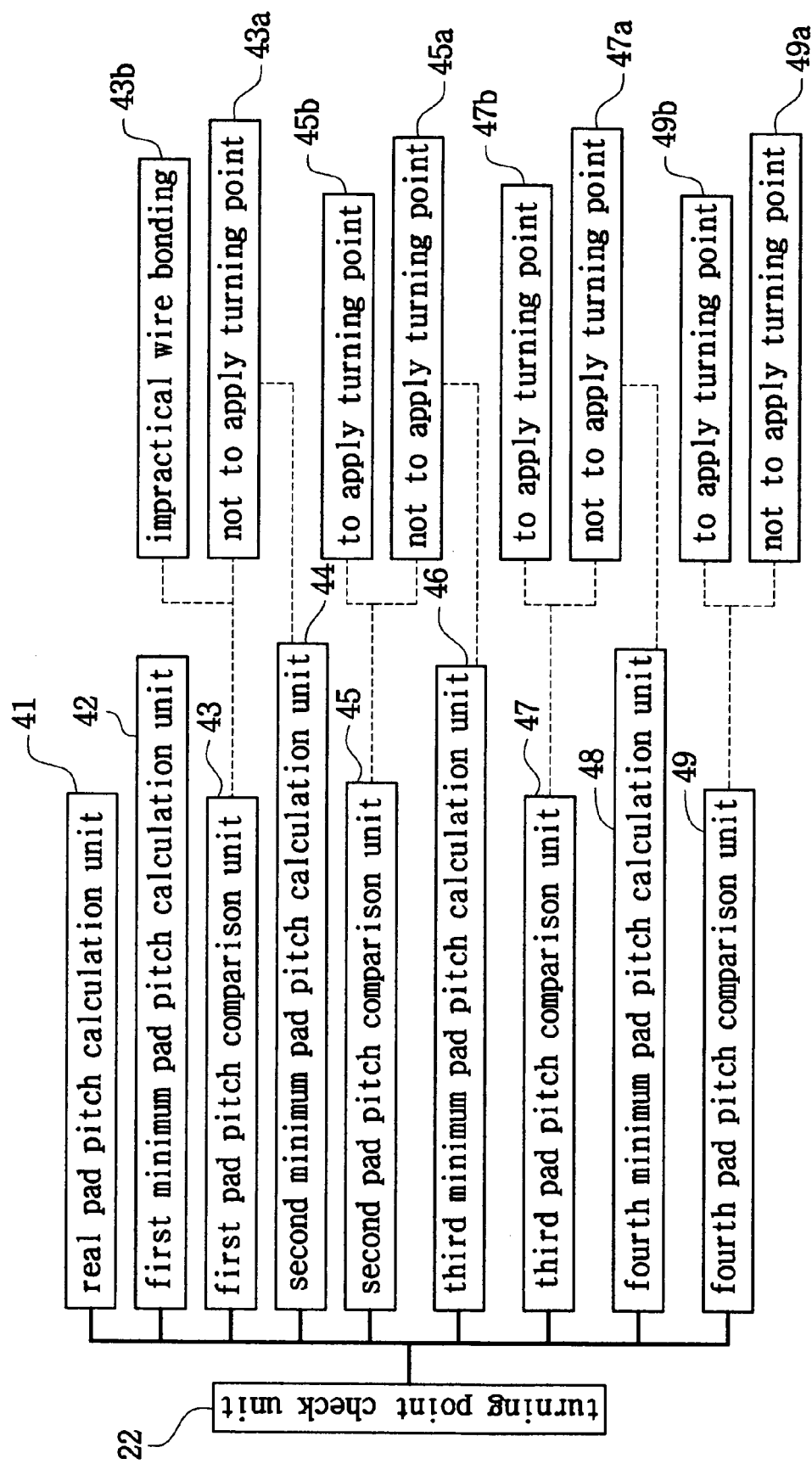
FIG. 3 illustrates a detailed block diagram of a turning point check unit as illustrated in FIG. 1.

FIG. 3 illustrates a detailed block diagram of the turning point check unit 22 illustrated in FIG. 1, according to an exemplary embodiment of the present invention. Referring to FIG. 3, the turning point check unit 22 may reduce the likelihood that a sagging failure occurs, which may result when a capillary of the wire bonder 40, not shown in FIG. 1 for simplicity, contacts a pre-bonded wire. The contact may occur for example, because of the wire angle and/or the bonding method. The turning point check unit 22 may create a first modified bonding sequence information, by altering the bonding sequence information so that unnecessary turning does not occur. Turning may change the order of two wires when a capillary is in contact with a pre-bonded wire, and may prevent a capillary from making contact with the pre-bonded wire. If the turning occurs, the moving distance of the wire bonder may be increased, and the efficiency of the wire bonder may thus decrease. Therefore, checking the turning point may provide useful information when performing wire bonding. To check the turning point, the turning point check unit 22 may use various data for example, the vector locus of a capillary, the wire angle, the dimensions of a capillary, and/or the loop height of the wire.

The turning point check unit 22 illustrated in FIG. 3, according to an exemplary embodiment of the present invention, may include for example, a real pad pitch calculation unit 41, a first minimum pad pitch calculation unit 42, and a first pad pitch comparison unit 43. For a right wire angle, a first minimum pad pitch may be defined as the lower limit between a first and second pad, where a capillary on the second pad may not touch a pre-bonded wire on the first pad. The first pad pitch comparison unit 43 may compare the real pad pitch with the first minimum pad pitch, and if the real pad pitch is greater than the first minimum pad pitch, the turning point may not be applied to the corresponding wire (see 43a). If for example, the real pad pitch is smaller than the first minimum pad pitch, the first pad pitch comparison unit 43 may determine that wire bonding is impractical (see 43b).

The turning point check unit 22, according to an exemplary embodiment of the present invention, may further include a second minimum pad pitch calculation unit 44 and second pad pitch comparison unit 45. If for example, a wire angle is determined to be a non-right wire angle then a second minimum pad pitch may be defined as the lower limit between the first and second pads where a capillary on the second pad is not in contact a pre-bonded wire on the first pad. The second pad pitch comparison unit 45 may compare the real pad pitch with the second minimum pad pitch, and if the real pad pitch is greater than the second minimum pad pitch, the turning point may not be applied to the corresponding wire (see 45a). If however, the real pad pitch is smaller than the second minimum pad pitch, the second pad pitch comparison unit 45 may apply the turning point to the corresponding wire (see 45b).

The turning point check unit 22 may also include a third minimum pad pitch calculation unit 46 and a third pad pitch comparison unit 47 as illustrated in FIG. 3. If for example, a reverse factor is applied to the wire bonding, a third minimum pad pitch may be defined as the lower limit between a first and second pad, and where a capillary on the second pad is not in contact with a pre-bonded wire on the first pad. The third pad pitch comparison unit 47 may compare the real pad pitch with the third minimum pad pitch. If the real pad pitch is greater than the third minimum pad pitch, the turning point may not be applied to a corresponding wire (see 47a). If the real pad pitch is smaller than the third minimum pad pitch, the third pad pitch comparison unit 47 may compare the wire angles of a real wire and a wire corresponding to the third minimum pad pitch. If the wire angle of the real wire is greater than the wire angle of the wire corresponding to the third minimum pad pitch, the third pad pitch comparison unit 47 may decide not to apply the turning point (see 47a). If the wire angle of the real wire is smaller, the third pad pitch comparison unit 47 may decide to apply the turning point (see 47b).

The turning point check unit 22 may further include a fourth minimum pad pitch calculation unit 48 and a fourth pad pitch comparison unit 49. When a reverse factor is applied to a center pad group, a fourth minimum pad pitch may be defined as the lower limit between first and second pads, where a capillary on the second pad is not in contact with a pre-bonded wire on the first pad. The fourth pad pitch comparison unit 49 may compare an real pad pitch with the fourth minimum pad pitch. If the real pad pitch is greater than the fourth minimum pad pitch, the turning point may not be applied to the corresponding wire (see 49a). If the real pad pitch is smaller than the fourth minimum pad pitch, the fourth pad pitch comparison unit 49 may decide to apply the turning point to the corresponding wire (see 49b).

The bonding sequence information 21 may be provided by the bonding sequence decision unit 20. The turning point check unit 22 may create the first modified bonding sequence information 23, by adding information about the turning point to the bonding sequence information 21.

The bonding simulation unit 24 may use a bonding simulation to verify the bonding operation during a wire bonding process based on the first modified bonding sequence information 23. The bonding simulation unit 24 may create a second modified bonding sequence information 25, by altering, for example by adding and/or deleting the first modified bonding sequence information 23.

The translator 28 may translate a standard file 27, which may be produced by the standard file generator 26 into a machine language file 29 compatible with the wire bonders of wire bonder 40. The translator 28 may include a parameter editor used to edit parameters in the standard file 27, to translate the data into a format suitable for use by the wire bonder 40. The parameter editor may convert parameters in the standard file 27 and/or may change the standard file 27 into a machine language file 29 that each of the wire bonders of wire bonder 40 may use to perform a wire bonding operation. The translator 28 may translate the standard file 27 separately for each wire bonder and/or simultaneously for several wire bonders.

Figure 4:
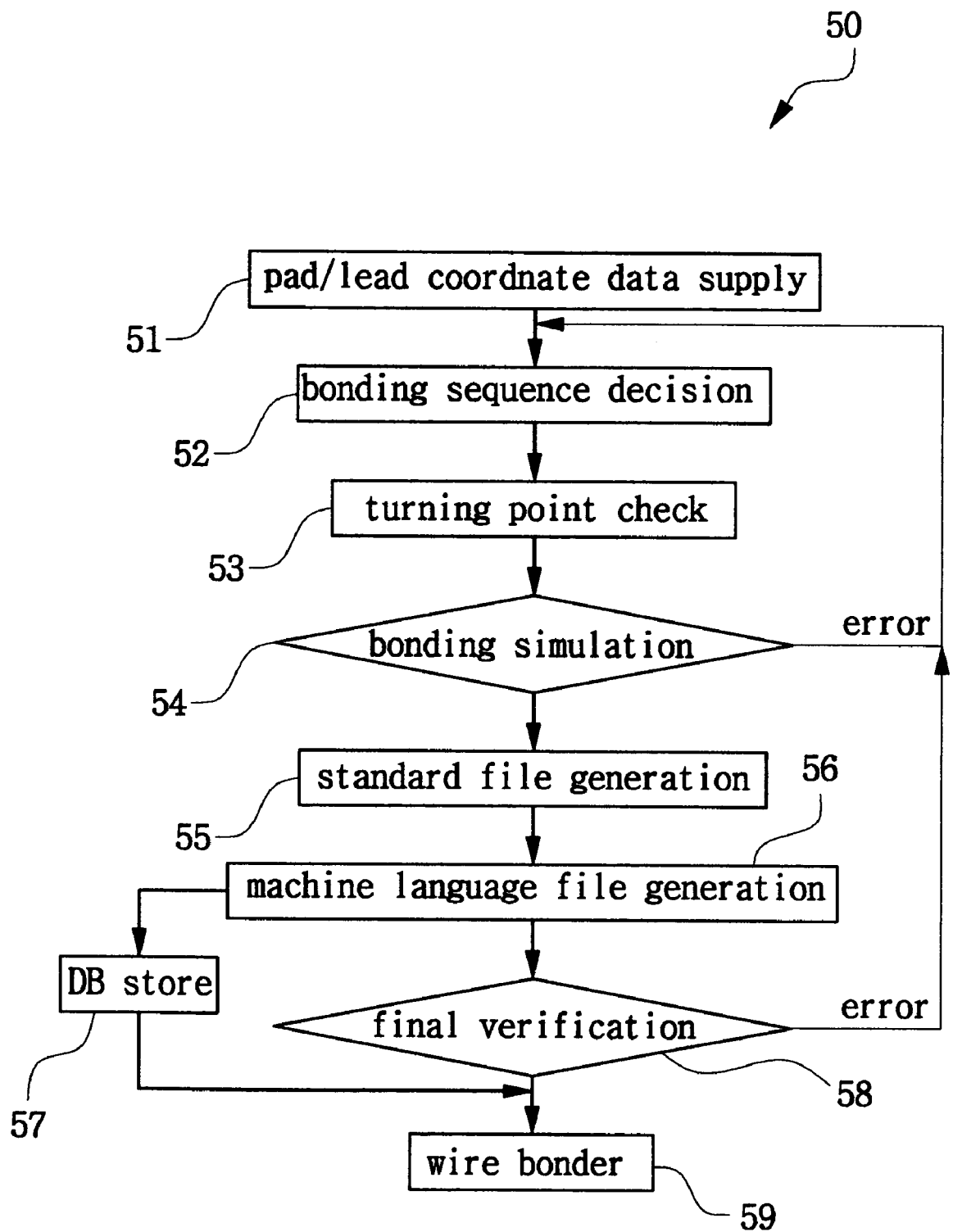
FIG. 4 illustrates a logic diagram showing a procedure for automatically determining a wire bonding sequence by using a bonder viewer system according to an exemplary embodiment of the present invention.

The bonder viewer system 30 may provide an automatic determining feature which for automatically determining a wire bonding sequence. FIG. 4 illustrates a logic diagram procedure (50) for automatically determining a wire bonding sequence.

Referring to FIG. 4 and FIG. 1, according to an exemplary embodiment of the present invention, the DMS 10 may supply the pad and/or lead coordinate data 12 and 14 to the bonding sequence decision unit 20 (see 51). The bonding sequence decision unit 20, may determine a bonding sequence based on the pad/lead coordinate data 12 and 14, and create the bonding sequence information 21 (see 52). The turning point check unit 22 may determine whether to apply a turning point to the wires based the bonding sequence information 21, and create the first modified bonding sequence information 23 (see 53). The bonding simulation unit 24 may perform a bonding simulation based on the first modified bonding sequence information 23, and create the second modified bonding sequence information 25. If an error occurs during the bonding simulation, the error data may be fed back to a corresponding previous operation, for example, back to the bonding sequence decision unit 20 (see 54 of FIG. 4), which may determine another bonding sequence based on information which may have been altered, added and/or deleted (see 54).

The standard file generator 26 may generate the standard file 27 based on the second modified bonding sequence information 25 (see 55). The translator 28 may translate the standard file 27 into a machine language file 29 usable by the wire bonder 40 (see 56), and may store the machine language file 29 in a database (see 57). The machine language file 29, which may be stored in the database, may be verified (see 58) and downloaded to the wire bonder 40 (see 59). If an error occurs during the verification, the error data may be fed back to a previous operation and the appropriate information may be altered, added and/or deleted.

The pad/lead coordinate data supplied to the bonding sequence decision unit, may include pad coordinate data 12 based on the centering of a pad, and/or lead coordinate data 14 based on a tip-offset length. Depending on the information provided by the DMS 10, the bonder viewer system 30 may create and/or modify different types of information used for wire bonding.

Figure 5:
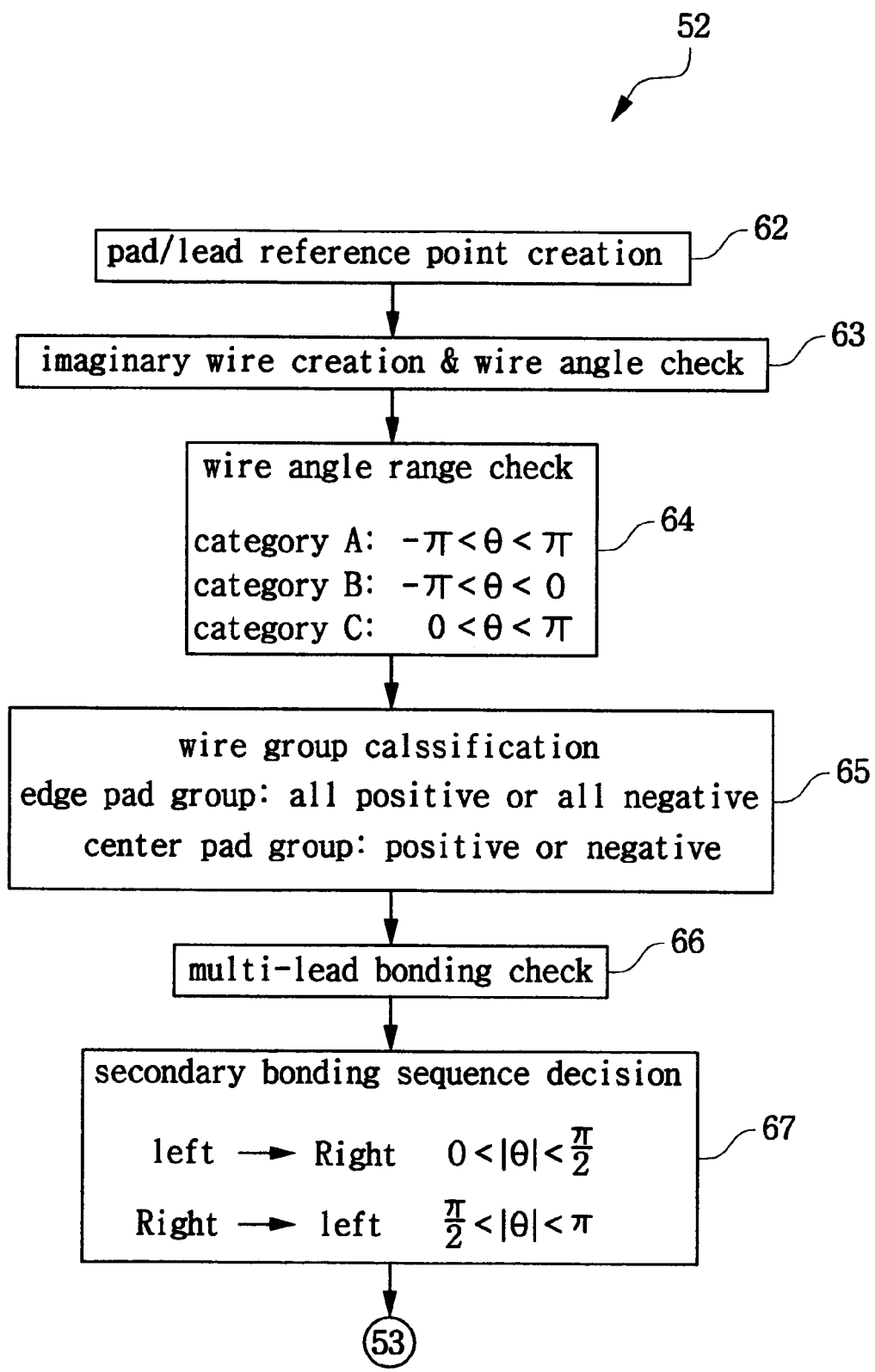
FIG. 5 illustrates a detailed logic diagram of a bonding sequence decision illustrated in FIG. 4.
Figure 6:
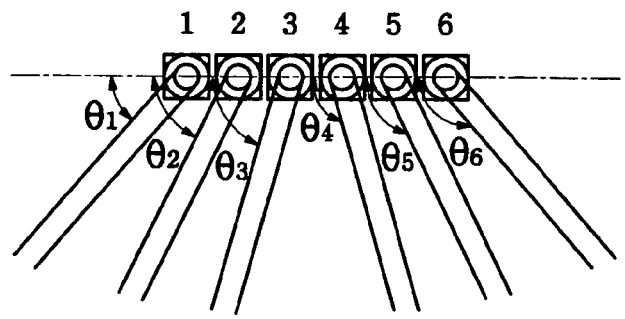
FIGS. 6 and 7 illustrate example views of a bonding sequence for a group of wires having a wire angle range of $0<\theta<\pi$.
Figure 7:
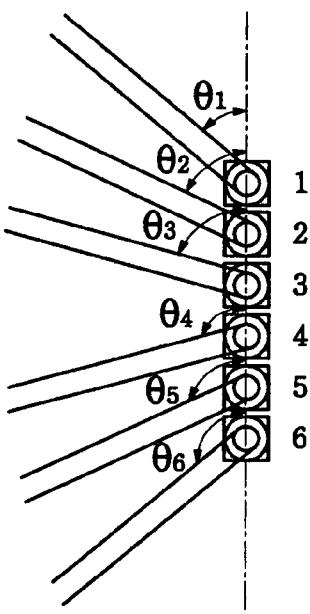

FIG. 5 illustrates a bonding sequence decision 52 of FIG. 4 in greater detail, and according to an exemplary embodiment of the present invention. Referring to FIG. 5, the bonding sequence decision 52 may include a pad/lead reference point creation 62, an imaginary wire creation and wire angle check 63, a wire angle range check 64, a wire group classification 65, a multi-lead bonding check 66, and a secondary bonding sequence decision 67.

The pad/lead reference point creation operation 62, may provide reference points of the pads and the leads of an IC chip, based on a left uppermost pad and related lead for an edge pad type chip, or a leftmost pad and corresponding lead for a center pad type chip. FIGS. 6 to 9 illustrate examples of wire bonding sequences. Pad 1 in FIG. 6 for example, indicates a reference point for the pads of a corresponding chip, and a lead (not shown) connected by a wire which may correspond to the reference point for the leads.

The imaginary wire creation and wire angle check operation 63 of FIG. 5, may include connecting imaginary wires to a pad and a lead based on the pair of reference points. The angle of a wire may be measured from a bonding direction to each imaginary wire, for example a counterclockwise direction from a reference point may be considered a bonding direction for an edge pad type chip.

Figure 8:
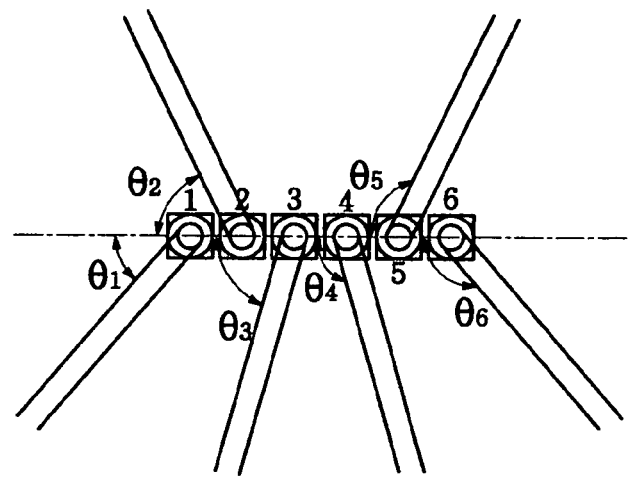
FIG. 8 illustrates an example view of a bonding sequence for a group of wires having a wire angle range of $-\pi<\theta<\pi$.

The wire angle range check 64 may examine a range that includes all the wire angles in a given wire group. Based on the range of the wire angles (θ), each wire group may then be assigned to a specific category; i.e., category A having a range of $-\pi<\theta<\pi$, category B having a range of $-\pi<\theta<0$, and category C having a range of $0<\theta<\pi$. The wire angles illustrated in FIGS. 6 and 7 for example, may be within the range of $0<\theta<\pi$, thus this wire group would belong to category C. The wire angles illustrated in FIG. 8 are within the range of $-\pi<\theta<\pi$ corresponding to category A. The wire group on the upper line of FIG. 9 including pads 1-6, contains wires with angles within the range of $-\pi<\theta<0$ corresponding to category B, and the wire group on the lower line including pads 7-12, contains wires with angles within the range of $0<\theta<\pi$ corresponding to category C.

The wire group classification procedure 65 may include for example, classifying the wire groups into an edge pad group and a center pad group in order to determine a bonding sequence for the wire groups. The edge pad group may include all positive wire angles or all negative wire angles, and the center pad group may include positive or negative wire angles. Therefore, a wire group in category A may be assigned to the center pad group, and a wire group in categories B or C may be assigned to the edge pad group, however center pads arranged in double lines may belong to an edge pad group.

Figure 10:
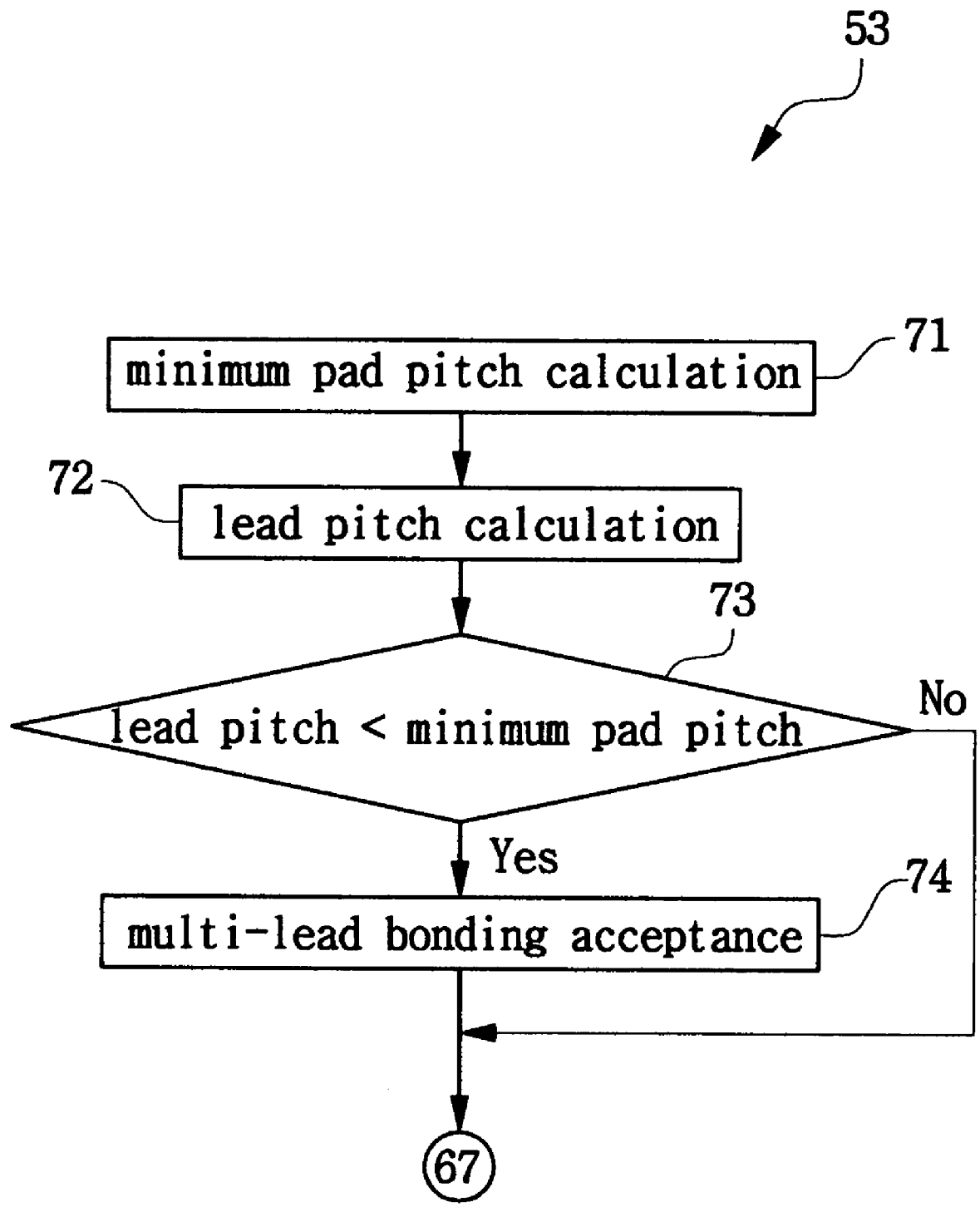
FIG. 10 illustrates a detailed logic diagram of a multi-lead bonding check operation illustrated in FIG. 5.

The multi-lead bonding check 66 may determine whether multi-lead bonding exists in each wire group. In FIG. 10, the multi-lead bonding check 66 includes a minimum pad pitch calculation 66a, a lead pitch calculation 66b, a pitch comparison 66c, and a multi-lead bonding acceptance 66d. After a minimum pad pitch and a lead pitch are calculated in 66a and 66b, both the minimum pad pitch and lead pitch may be compared to determine if the lead pitch is smaller than the minimum pad pitch, and if the lead pitch is smaller, then multi-lead bonding may be determined as acceptable.

Figure 11:
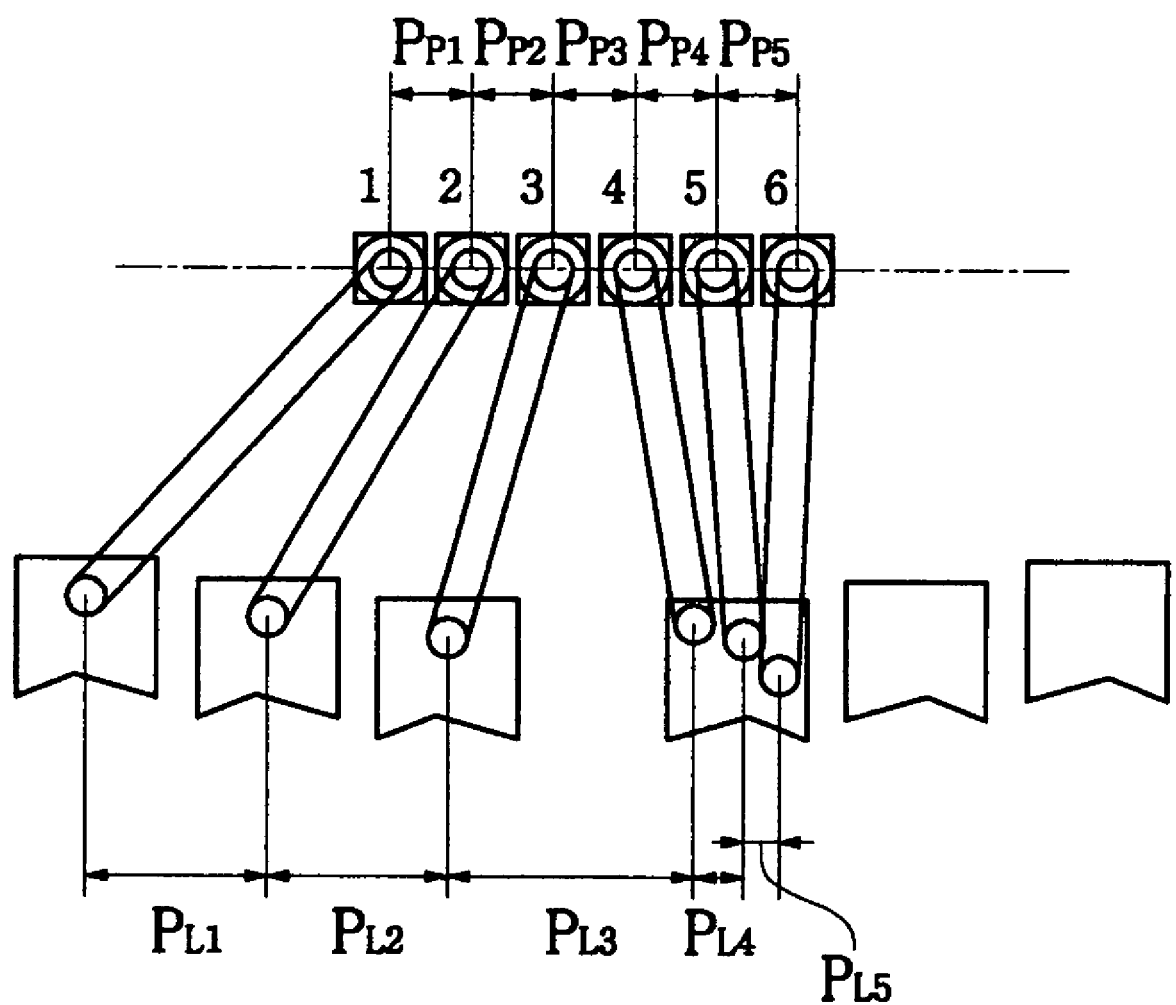
FIG. 11 illustrates an exemplary view of multi-lead bonding, according to an exemplary embodiment of the present invention.

FIG. 11 illustrates a series of pad pitches Pp(1-5) and lead pitches PL(1-5). The multi-lead bonding check 66 of FIG. 10 for example, may compare the pad pitches to the lead pitches and determine if multi-lead bonding is acceptable. PL(4-6) for example, are smaller than the pad pitches of the corresponding pads 4-6. Therefore, multi-lead bonding is determined to be an acceptable procedure for the wire bonder.

The bonding sequence for multi-lead bonding may be the opposite of single bonding individual wires. For example, referring to FIG. 11, a bonding sequence which bonds wires individually may perform bonding in an out of order sequence. The individual bonding of wires may be performed in an order of 1, 2, 3, 6, 5, 4. However, the actual bonding sequence illustrated in FIG. 11 follows a sequence order of 1, 2, 3, 4, 5, 6, because the pads from 4 to 6 were formed using multi-lead bonding.

The secondary bonding sequence decision 67 may determine the bonding sequence of the wires within each wire group. The bonding sequence may be determined from the left to the right where the wire angle is $0<|\theta|<\pi/2$, and from the right to the left where the wire angle is $\pi/2<|\theta|<\pi$. For example, the edge pad group in FIGS. 6 and 7 contains wires 1-3 having corresponding wire angles θ1, θ2 and θ3 respectively, and within the wire angle range of $0<|\theta|<\pi/2$. Thus the wire bonding may be performed in numerical order. However, wires 4-6 having corresponding wire angles θ4, θ5 and θ6 respectively, and within the wire range of $\pi/2<|\theta|<\pi$ may have wire bonding performed in an order opposite to numerical order for example, in the order of 6-4.

Figure 9:
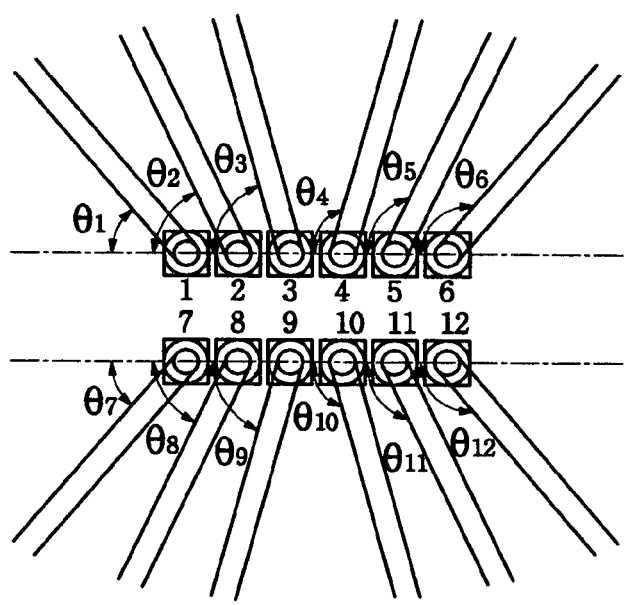
FIG. 9 illustrates an example view of a bonding sequence for a group of wires having a wire angle range of $-\pi<\theta<0$.

FIG. 8 illustrates an example of a center pad group where wire bonding may be performed in an order of 1, 2, 3, 6, 5 and 4. FIG. 9 illustrates an edge group having double center pad lines, in this instance wire bonding may be performed in an order of 1, 2, 3, 6, 5, 4, 7, 8, 9, 12, 11 and 10. These wire bonding sequence operations are examples of the types of wire bonding which may be provided by the bonding sequence decision 52 illustrated in FIGS. 4 and 5.

Figure 12:
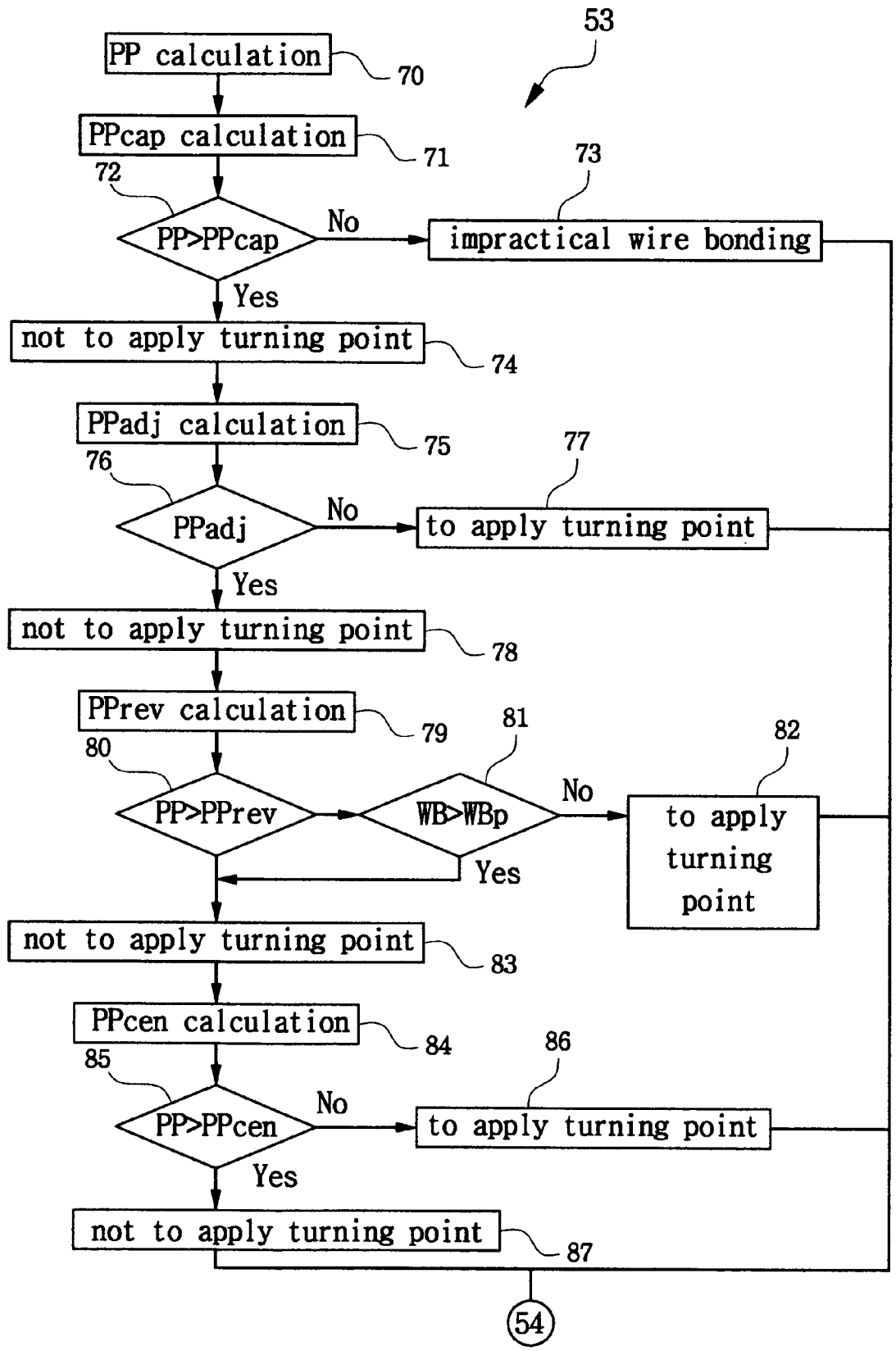
FIG. 12 illustrates a detailed logic diagram of a turning point check operation as illustrated in FIG. 4.
Figure 13:
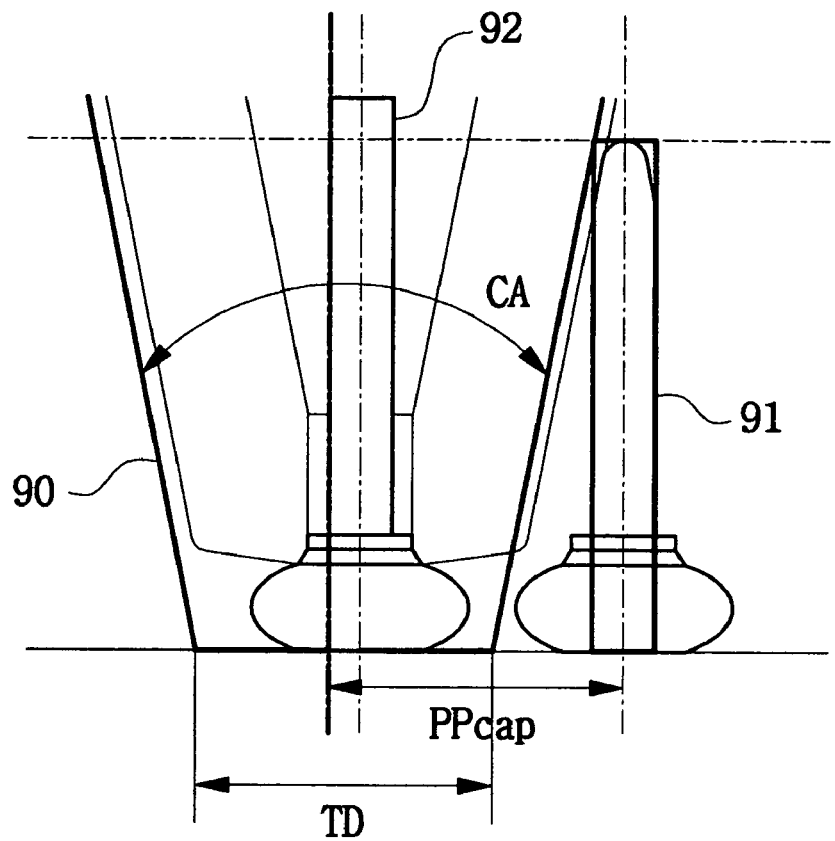
FIGS. 13 to 16 illustrate exemplary views for checking a turning point according to exemplary embodiments of the present invention.
Figure 15:
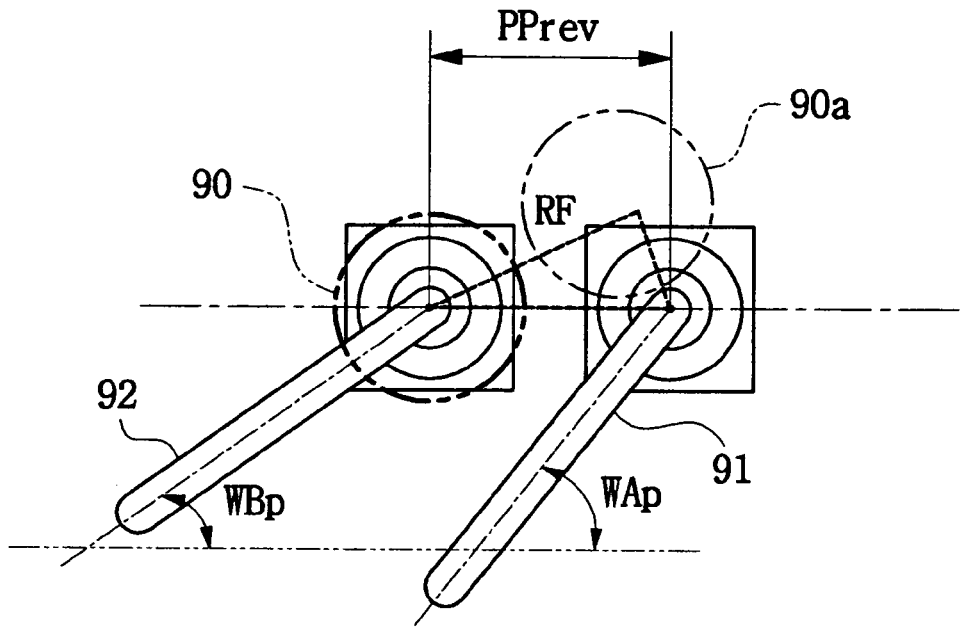
Figure 16:
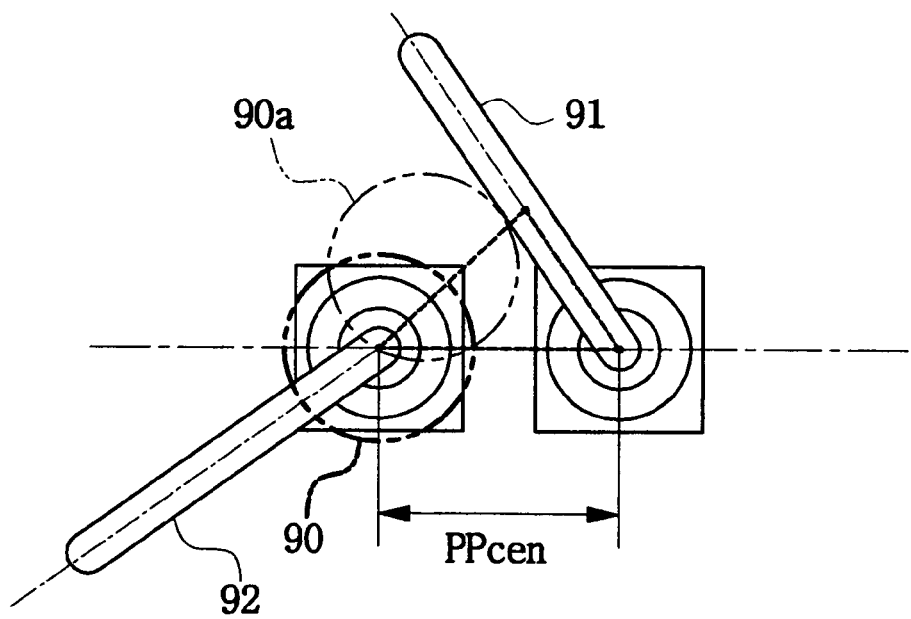

The turning point check 53 illustrated in FIG. 4, is further defined in greater detail by FIG. 12, according to an exemplary embodiment of the present invention. Referring to FIG. 12, the turning point check 53 may provide a real pad pitch (PP) calculation 70, and include additional comparison and/or determination operations. FIGS. 13 to 16 illustrate the checking of a turning point. FIG. 13 for example, illustrates a right wire angle, and FIG. 14 a non-right wire angle. FIG. 15 illustrates a reverse factor being applied to the wire bonding, and FIG. 16 illustrates a reverse factor being applied to a center pad type group.

Referring to FIGS. 12 and 13, a first minimum pad pitch (PPcap) may be calculated 71 from a lower limit between first and second pads. Capillary 90 may provide bonding of a second wire 92 to a second pad without contacting a first wire 91 pre-bonded on a first pad. Real pad pitch (PP) may be compared with the first minimum pad pitch (PPcap) in a first comparison operation 72. If the real pad pitch (PP) is greater than the first minimum pad pitch (PPcap), the turning point may not be applied to the corresponding wire 74, otherwise, wire bonding may not be practical 73, therefore the size of the capillary 90 should be changed. In FIG. 13, characters CA and TD indicate the angle and the diameter of a capillary tip, respectively.

Figure 14:
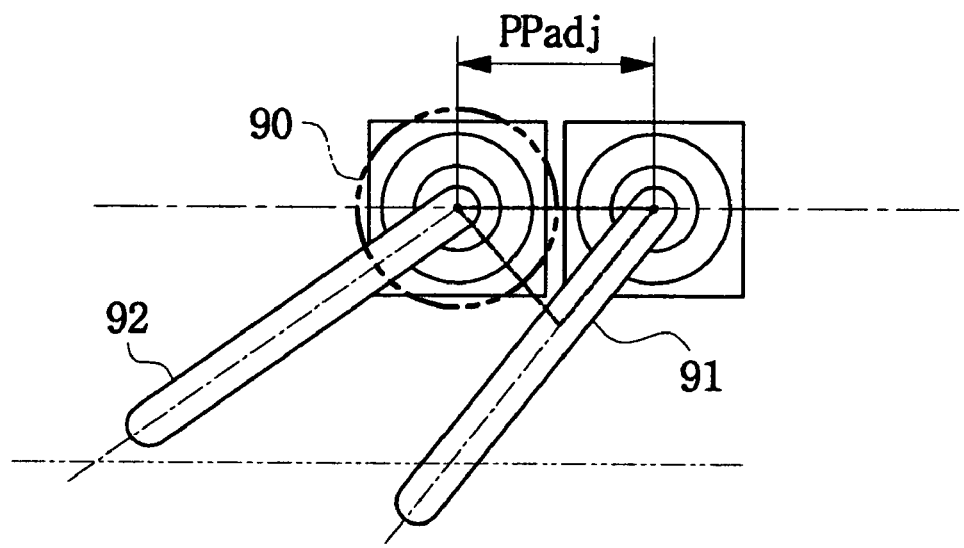

Referring to FIGS. 12 and 14, a second minimum pad pitch (PPadj) may be calculated based on the lower limit between two pads for example, a first and second pad. A capillary 90 for a second wire 92 on the second pad should not be in contact with the pre-bonded first wire 91 on the first pad, as illustrated in operation 75 of FIG. 12. The real pad pitch (PP) may be compared with the second minimum pad pitch (PPadj) in a second comparison operation 76. If the real pad pitch (PP) is greater than the second minimum pad pitch (PPadj), the turning point may not be applied to the corresponding wire (78), otherwise, the turning point may be applied (77).

Referring to FIGS. 12 and 15, a third minimum pad pitch (PPrev) may be calculated from a lower limit between two pads for example, a first and second pad where a capillary 90 for the second wire 92 on the second pad is not in contact with the pre-bonded first wire 91 on the first pad (79). The real pad pitch (PP) may then be compared with the third minimum pad pitch (PPrev) in a third comparison operation 80. If the real pad pitch (PP) is greater than the third minimum pad pitch (PPrev), the turning point may not be applied to the corresponding wire (see operation 83), otherwise, a wire angle (WB) of a second wire may be compared with the wire angle (WBp) of a second wire corresponding to the third minimum pad pitch (PPrev) (see operation 81). If the wire angle (WB) of the second wire is greater than the wire angle (WBp) of the second wire corresponding to the third minimum pad pitch (PPrev), the turning point may not be applied (83), otherwise, the turning point may be applied (82).

A reverse factor may be used to form a more stable wire loop for an actual wire bonding procedure. For example, during an actual wire bonding, a capillary 90 may not release wire just above the pad, but instead may retreat away from the pad and release wire on the back portion of the pad. Therefore, a retreating distance (RF) of a capillary 90 according to an exemplary embodiment of FIG. 15, may be determined based on whether the reversed capillary 90a for example, is in contact with a first wire 91.

Referring to FIGS. 12 and 16, a fourth minimum pad pitch (PPcen) may be calculated (84) from a lower limit between two pads for example, a first and second pad, and where a capillary 90 for a second wire 92 on the second pad may not touch a pre-bonded first wire 91 on the first pad. The real pad pitch (PP) may then be compared with a fourth minimum pad pitch (PPcen) in a fourth comparison operation 85. If the real pad pitch (PP) is greater than the fourth minimum pad pitch (PPcen), the turning point may not be applied (87), otherwise, the turning point may be applied (86).

The details of the turning point check operation 53 illustrated in FIGS. 4 and 12, should not be limited to only the examples disclosed this far, and should be considered as adaptable to other wiring configurations.

Referring to FIG. 4, the first modified bonding sequence information may be created by adding the results of the turning point check operation 53 to the bonding sequence information of the bonding sequence decision 52.

The bonding simulation operation 54 may be performed to verify if a wrong bonding operation occurred based on the first modified bonding sequence information. The bonding simulation may provide the second modified bonding sequence information by altering, adding and/or deleting the first modified bonding sequence information.

The standard file generation 55, and the machine language file generation 56 may be provided to translate the standard file into a machine language file. The machine language file may then be stored in a database (see operation 57). The machine language file stored in the database may then be verified 58 and downloaded to the wire bonders or wire bonder 40 illustrated in FIG. 1. If an error occurs in the verification 58, the error data may be fed back to a previous operation and the related information may be altered, added and/or deleted.

While this invention has been particularly shown and described with reference to exemplary embodiments thereof, it will be understood by those skilled in the art that various changes in form and details may be made therein without departing from the spirit and scope of the invention as defined by the following claims.

What is claimed is:

1. A system comprising:
   a bonding sequence decision unit receiving wire bonding information, and generating bonding sequence information;
   a turning point check unit checking whether a capillary of a wire bonder is in contact with a pre-bonded wire, and deciding whether to change the bonding sequence information based on the pre-bonded wire, and creating a first modified bonding sequence information;
   a bonding simulation unit performing a bonding simulation based on the first modified bonding sequence information, and creating a second modified bonding sequence information based on the bonding simulation,
   wherein, the turning point check unit includes:
      a real pad pitch calculation unit calculating a real pad pitch;
      a first minimum pad pitch calculation unit for calculating a first minimum pad pitch; and
      a first pad pitch comparison unit comparing the real pad pitch with the first minimum pad pitch, wherein the first minimum pad pitch is defined as the lower limit between a first and second pad of an IC, where a capillary on the second pad does not touch a pre-bonded wire on the first pad, and wherein if the real pad pitch is greater than the first minimum pad pitch, the turning point is not applied, and if the real pad pitch is smaller than the first minimum pad pitch, the first pad pitch comparison unit determines not to apply wire bonding.

2. The system of claim 1, further comprising:
   a standard file generator generating a standard file based on the second modified bonding sequence information; and
   a translator translating the standard file into a machine language file.

3. The system of claim 2, further comprising:
   a drawing management system generating at least two types of wire bonding information and providing said information to the bonding sequence decision unit; and
   at least one wire bonder performing wire bonding based on the machine language file of the translator.

4. The system of claim 1, wherein the bonding sequence decision unit includes a pad/lead reference point creation unit establishing at least two bonding start points for choosing a bonding direction, wherein the at least two bonding start points includes a first reference point of an integrated circuit (IC) chip, and a second reference point for leads of a substrate.

5. The system of claim 4, wherein the pad/lead reference point creation unit sets the first reference point to a left uppermost pad, and the second reference point to the left uppermost pad allowing at least one lead to be wire-bonded to the left uppermost pad, when the IC is an edge pad type chip.

6. The system of claim 5, wherein the pad/lead reference point creation unit sets the at least two reference points to the leftmost pad when the IC is a center pad type chip having a single pad line, and when the center pad type chip has double pad lines the at least two reference points are set to the leftmost pad in an upper line of the double pad lines.

7. The system of claim 1, wherein the bonding sequence decision unit further includes an imaginary wire creation unit that creates imaginary wires by individually connecting pads of the IC to leads based on the at least two reference points.

8. The system of claim 7, wherein the bonding sequence decision unit further includes a wire angle check unit that measures an angle formed by at least one of the imaginary wires created and the bonding direction of the at least one imaginary wire created.

9. The system of claim 7, wherein the bonding sequence decision unit further includes a wire angle range check unit that determines a range for the imaginary wire angles for at least two groups of imaginary wires.

10. The system of claim 7, wherein the bonding sequence decision unit further includes a wire group classification unit that classifies the at least two groups of imaginary wires individually into either an edge pad group and a center pad group, for deciding the bonding sequence of the at least two imaginary wire groups.

11. The system of claim 7, wherein the bonding sequence decision unit further includes a multi-lead bonding check unit that determines if multi-lead bonding exists in the at least two imaginary wire groups.

12. The system of claim 11, wherein the multi-lead bonding check unit includes
a minimum pad pitch calculation unit that calculates a minimum pad pitch from at least one of the at least two imaginary wire groups;
a lead pitch calculation unit that calculates a lead pitch; and
a pitch comparison unit that compares the lead pitch with the minimum pad pitch, and if the lead pitch is smaller than the minimum pad pitch then the wire bonding is designated as multi-lead bonding.

13. The system of claim 9, wherein the bonding sequence decision unit further includes a secondary bonding sequence decision unit that decides a bonding sequence of the imaginary wires within the at least two imaginary wire groups.

14. The system of claim 13, wherein the secondary bonding sequence decision unit determines the bonding sequence from left to right when a wire angle θ is $0<|\theta|<\pi/2$, and from the right to the left when θ is $\pi/2<|\theta|<\pi$.

15. The system of claim 1, wherein the turning point check unit further includes
a second minimum pad pitch calculation unit for calculating a second minimum pad pitch; and
a second pad pitch comparison unit comparing the real pad pitch with the second minimum pad pitch, wherein the second minimum pad pitch is defined as the lower limit between the first and second pads, where a capillary on the second pad does not touch a pre-bonded wire on the first pad, and if the real pad pitch is greater than the second minimum pad pitch, the turning point is not applied, and if the real pad pitch is smaller than the second minimum pad pitch, the turning point is applied.

16. The system of claim 15, wherein, when a reverse factor is applied to a wire bonding, the turning point check unit further includes
a third minimum pad pitch calculation unit for calculating a third minimum pad pitch; and
a third pad pitch comparison unit comparing the real pad pitch with the third minimum pad pitch, wherein the third minimum pad pitch is defined as the lower limit between first and second pads where a capillary on the second pad does not touch a pre-bonded wire on the first pad, wherein if the real pad pitch is greater than the third minimum pad pitch, the turning point is not applied, and if the real pad pitch is smaller than the third minimum pad pitch, the third pad pitch comparison unit compares a wire angle of a real wire to a wire angle of a wire corresponding to the third minimum pad pitch.

17. The system of claim 16, wherein, when a reverse factor is applied to a center pad group, the turning point check unit further includes
a fourth minimum pad pitch calculation unit for calculating a fourth minimum pad pitch; and
a fourth pad pitch comparison unit comparing the real pad pitch with the fourth minimum pad pitch, wherein the fourth minimum pad pitch is defined as the lower limit between first and second pads where a capillary on the second pad does not touch a pre-bonded wire on the first pad, wherein if the real pad pitch is greater than the fourth minimum pad pitch, the turning point is not applied, and if the real pad pitch is smaller than the fourth minimum pad pitch, the turning point is applied.

18. The system of claim 2, wherein the translator includes a parameter editor that converts parameters in the standard file into a machine language file for the wire bonders.

19. A system comprising:
a bonding sequence decision unit receiving wire bonding information, and generating bonding sequence information;
a turning point check unit checking whether a capillary of a wire bonder is in contact with a pre-bonded wire, and deciding whether to change the bonding sequence information based on the pre-bonded wire, and creating a first modified bonding sequence information;
a bonding simulation unit performing a bonding simulation based on the first modified bonding sequence information, and creating a second modified bonding sequence information based on the bonding simulation,
wherein the bonding sequence decision unit further includes an imaginary wire creation unit that creates imaginary wires by individually connecting pads of the IC to leads based on the at least two reference points, and
wherein, the turning point check unit includes:
a real pad pitch calculation unit calculating a real pad pitch;
a first minimum pad pitch calculation unit for calculating a first minimum pad pitch; and
a first pad pitch comparison unit comparing the real pad pitch with the first minimum pad pitch, wherein the first minimum pad pitch is defined as the lower limit between a first and second pad of an IC, where a capillary on the second pad does not touch a pre-bonded wire on the first pad, and wherein if the real pad pitch is greater than the first minimum pad pitch, the turning point is not applied, and if the real pad pitch is smaller than the first minimum pad pitch, the first pad pitch comparison unit determines not to apply wire bonding.

20. A system comprising:
a bonding sequence decision unit receiving wire bonding information, and generating bonding sequence information;
a turning point check unit checking whether a capillary of a wire bonder is in contact with a pre-bonded wire, and deciding whether to change the bonding sequence information based on the pre-bonded wire, and creating a first modified bonding sequence information;
a bonding simulation unit performing a bonding simulation based on the first modified bonding sequence information, and creating a second modified bonding sequence information based on the bonding simulation,
wherein, the turning point check unit includes:
a real pad pitch calculation unit calculating a real pad pitch;

a first minimum pad pitch calculation unit for calculating a first minimum pad pitch; and a first pad pitch comparison unit comparing the real pad pitch with the first minimum pad pitch, wherein the first minimum pad pitch is defined as the lower limit between a first and second pad of an IC, where a capillary on the second pad does not touch a pre-bonded wire on the first pad, and wherein if the real pad pitch is greater than the first minimum pad pitch, the turning point is not applied, and if the real pad pitch is smaller than the first minimum pad pitch, the first pad pitch comparison unit determines not to apply wire bonding, and wherein, the turning point check unit further includes:

a second minimum pad pitch calculation unit for calculating a second minimum pad pitch; and a second pad pitch comparison unit comparing the real pad pitch with the second minimum pad pitch, wherein the second minimum pad pitch is defined as the lower limit between the first and second pads, where a capillary on the second pad does not touch a pre-bonded wire on the first pad, and if the real pad pitch is greater than the second minimum pad pitch, the turning point is not applied, and if the real pad pitch is smaller than the second minimum pad pitch, the turning point is applied.

* * * * *